(12) United States Patent
Kane et al.

(10) Patent No.: US 8,044,009 B2
(45) Date of Patent: Oct. 25, 2011

(54) COMPOSITIONS FOR CLEANING ION IMPLANTED PHOTORESIST IN FRONT END OF LINE APPLICATIONS

(75) Inventors: Sean Michael Kane, Lyndhurst, OH (US); Steven A. Lippy, Wind Gap, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 631 days.

(21) Appl. No.: 11/817,874

(22) PCT Filed: Mar. 13, 2006

(86) PCT No.: PCT/US2006/008829
§ 371 (c)(1), (2), (4) Date: Sep. 6, 2007

(87) PCT Pub. No.: WO2006/107517
PCT Pub. Date: Oct. 12, 2006

(65) Prior Publication Data
US 2008/0171682 A1 Jul. 17, 2008

(51) Int. Cl.
*G03F 7/42* (2006.01)
(52) U.S. Cl. .......................... 510/175; 134/1.3
(58) Field of Classification Search .................. 510/175; 134/1.3
See application file for complete search history.

(56) References Cited

U.S. PATENT DOCUMENTS

| | | | |
|---|---|---|---|
| 4,491,530 A | 1/1985 | Thomas et al. | |
| 5,972,862 A | 10/1999 | Tori et al. | |
| 6,071,827 A | 6/2000 | Lim et al. | |
| 6,323,169 B1 | 11/2001 | Abe et al. | |
| 6,500,605 B1 | 12/2002 | Mullee et al. | |
| 6,534,459 B1 | 3/2003 | Yata et al. | 510/176 |
| 6,677,286 B1 | 1/2004 | Rovito et al. | |
| 6,715,944 B2 * | 4/2004 | Oya et al. | 396/626 |
| 6,777,380 B2 | 8/2004 | Small et al. | 510/176 |
| 6,783,695 B1 | 8/2004 | Torek et al. | |
| 7,419,945 B2 * | 9/2008 | Hsu | 510/175 |
| 2002/0037820 A1 | 3/2002 | Small et al. | |
| 2002/0146647 A1 | 10/2002 | Aoki et al. | |
| 2002/0146911 A1 | 10/2002 | Muranaka et al. | |
| 2003/0004075 A1 | 1/2003 | Suto et al. | 510/175 |
| 2003/0114014 A1 | 6/2003 | Yokoi et al. | |
| 2003/0181342 A1 | 9/2003 | Seijo et al. | |
| 2004/0038154 A1 | 2/2004 | Muramatsu et al. | |
| 2004/0038839 A1 * | 2/2004 | Kim et al. | 510/175 |
| 2004/0106531 A1 | 6/2004 | Kanno et al. | |
| 2004/0112409 A1 | 6/2004 | Schilling | |
| 2004/0175948 A1 * | 9/2004 | DeSimone et al. | 438/690 |
| 2005/0014667 A1 | 1/2005 | Aoyama et al. | |
| 2005/0176602 A1 * | 8/2005 | Hsu | 510/175 |
| 2005/0239673 A1 * | 10/2005 | Hsu | 510/176 |
| 2006/0154839 A1 * | 7/2006 | Ilardi et al. | 510/175 |
| 2007/0060490 A1 * | 3/2007 | Skee | 510/175 |
| 2009/0163396 A1 * | 6/2009 | Hsu | 510/176 |

FOREIGN PATENT DOCUMENTS

| | | |
|---|---|---|
| EP | 0 827 188 | 3/1998 |
| EP | 1 035 446 | 9/2000 |
| TW | 521336 | 2/2003 |
| WO | WO 01/14510 | 3/2001 |

* cited by examiner

*Primary Examiner* — Gregory Webb
(74) *Attorney, Agent, or Firm* — Ohlandt, Greeley, Ruggiero & Perle, LLP; George W. Rauchfuss, Jr.

(57) ABSTRACT

A front end of the line (FEOL) stripping and cleaning composition for cleaning unashed ion-implanted photoresist from a wafer substrate comprises: a) at least one organic stripping solvent, b) fluoride ions from at least one of ammonium fluoride, ammonium bifluoride or hydrogen fluoride, c) at least one acidifying agent selected from inorganic or organic acids, and d) water, with an oxidizing agent optionally also being present in the composition.

9 Claims, No Drawings

COMPOSITIONS FOR CLEANING ION IMPLANTED PHOTORESIST IN FRONT END OF LINE APPLICATIONS

FIELD OF THE INVENTION

This invention pertains to cleaning compositions for cleaning of wafers exposed to the wafer doping process in a front end of the line operation in the production of microelectronic devices. This invention provides compositions and processes for removal of implanted bulk photoresist and cleaning of wafers in a front end of the line operation.

BACKGROUND TO THE INVENTION

Ion implantation through resist-coated wafers is employed to control the doping levels in integrated circuit fabrication. The number of photoresist cleaning or stripping steps employed in the front end of the line (FEOL) semiconductor manufacturing process has grown greatly in the last few years. The increasing number of ion implantation steps needed in the device manufacturing process has driven this increase. Current high-current or high-energy implant operations (high dose implantation or HDI) are the most demanding in that they require a high degree of wafer cleanliness to be obtained while minimizing or eliminating photoresist popping, surface residues, and metal contamination, while requiring substantially no substrate/junction loss, or oxide loss.

The reason that HDI presents a particularly challenging FEOL cleaning operation is due to the physical structure of the post-implanted resist which becomes hardened and difficult to remove, as it must be before patterning operational steps are undertaken, where a different photoresist is applied for line patterning. The ion implantation process effectively depletes the surface of the resist of hydrogen and impregnates the resist film with the implant species. As a result of the implant species penetrating into the resist, the resist is transformed into two distinct layers, an outer, hardened, carbonized crust layer and an inner, bulk hydrogenated layer. Because the outer, carbonized layer has been essentially depleted of hydrogen, it can ash about 75% more slowly than the underlying inner, bulk photoresist layer. Additionally, this inner, bulk layer contains relatively high levels of chemically bonded nitrogen and marginal levels of the original casting solvent, which rapidly outgasses and expands when subjected to elevated ashing temperatures. This phenomenon causes photoresist popping as the outer, carbonized crust layer expands at a much slower rate than the underlying volatilized solvents causing the crust to rupture or "pop". Photoresist popping is probably the greatest source of process defects with a plasma ashing system. The effects of the popping residues are a relatively high level of particles on implanted wafers, highly oxidized surface residues requiring aggressive post-ash wet cleans, and more frequent chamber cleaning and preventive maintenance procedures. Moreover, as residues accumulate in the process chamber, the probability of particles re-depositing on other wafers also increases. Another factor is that HDI can sputter silicon or silicon dioxide from the wafer substrate and deposit residues on top of the resist.

Therefore, following the ion implantation step(s) the resist and unwanted residues should be completely removed leaving the wafer surface residue-free, otherwise ineffective residue removal has the potential for high levels of process defects, and the quality of the cleaning step can directly effect electrical yield. Dry ashing followed by wet chemistry washing, e.g., oxygen plasma and a piranha wet-clean application, a mixture of sulfuric acid with either hydrogen peroxide or ozone, has generally been used to remove the hardened resist and residues. This process is costly and hazardous and also does not effectively remove inorganic residues, such as implant species, silicon, silicon dioxide and resist additives. Additionally, further wet chemistries are then required to remove these inorganic residues. Moreover, such dry ashing followed by those wet chemistry cleans causes unwanted damage to the doped wafers, i.e., to the source and drain areas of the doped wafer. Therefore, there is, a need for FEOL cleaning compositions that can effectively and efficiently strip-clean photoresist and ion implantation residues from ion implanted wafers, and for such strip-cleaning compositions that do not cause corrosion, i.e., alteration of the wafer structure in regard to the source and drain areas of the doped wafer.

BRIEF SUMMARY OF THE INVENTION

In accordance with this invention, there are provided FEOL stripping and cleaning compositions for cleaning photoresist and other residue from ion-implanted wafers in a FEOL operation, the compositions comprising: at least one organic stripping solvent, fluoride ions from at least one of ammonium fluoride, ammonium bifluoride and hydrofluoric acid, at least one inorganic or organic acid, and water, and methods for FEOL cleaning ion-implanted wafer surfaces with these compositions. The FEOL stripping-cleaning compositions of this invention preferably also have an oxidizing agent added thereto, just prior to the intended time of use of the compositions. The FEOL strip-cleaning compositions of this invention essentially eliminate the need for any ashing step prior to a wet chemistry clean, instead allowing the stripping/cleaning of the photoresist and residues in a single step with the compositions of this invention.

The FEOL stripping and cleaning compositions of this invention for stripping-cleaning ion-implanted wafer substrates comprise compositions of:
 a) at least one organic stripping solvent,
 b) fluoride ions from at least one of ammonium fluoride, ammonium bifluoride or hydrogen fluoride,
 c) at least one acidifying agent selected from inorganic or organic acids, and
 d) water.

The FEOL strip-cleaning compositions of this invention also comprise compositions of:
 a) at least one organic stripping solvent,
 b) fluoride ions from at least one of ammonium fluoride, ammonium bifluoride or hydrogen fluoride,
 c) at least one acidifying agent selected from inorganic or organic acids,
 d) water, and
 e) an oxidizing agent.

In these latter compositions, the oxidizing agent is generally added to the former composition of the other components at a time generally just before the intended time of use of the composition. The FEOL compositions of this invention may additionally comprise one or more components such as metal-complexing/corrosion resisting compounds, other corrosion inhibitors and surfactants.

The method for FEOL stripping-cleaning of the ion-implanted wafer substrates according to this invention comprises a method for cleaning the ion-implanted wafer substrates without producing any substantial metal corrosion, the process comprising contacting the ion-implanted wafer substrate with a FEOL strip-cleaning composition of this invention for a time sufficient to clean the ion-implanted wafer substrate, wherein the FEOL stripping-cleaning compositions comprise:
  a) at least one organic stripping solvent,
  b) fluoride ions from at least one of ammonium fluoride, ammonium bifluoride or hydrogen fluoride,
  c) at least one acidifying agent selected from inorganic or organic acids, and
  d) water.

The FEOL strip-cleaning compositions to be used in the strip-cleaning method of this invention also comprise compositions of:
  a) at least one organic stripping solvent,
  b) fluoride ions from at least one of ammonium fluoride, ammonium bifluoride or hydrogen fluoride,
  c) at least one acidifying agent selected from inorganic or organic acids,
  d) water, and
  e) an oxidizing agent.

In such latter compositions, the oxidizing agent is generally added to the former composition of the other components at a time generally just before the intended time of use of the composition. The FEOL compositions to be used in the strip-cleaning method of this invention may additionally comprise one or more components such as metal-complexing/corrosion resisting compounds, other corrosion inhibitors and surfactants.

DETAILED DESCRIPTION OF THE INVENTION AND PREFERRED EMBODIMENTS

The FEOL stripping and cleaning compositions of this invention for stripping-cleaning ion-implanted wafer substrates comprise compositions of:
  a) at least one organic stripping solvent,
  b) fluoride ions from at least one of ammonium fluoride, ammonium bifluoride or hydrogen fluoride,
  c) at least one acidifying agent selected from inorganic or organic acids, and
  d) water.

The FEOL strip-cleaning compositions of this invention also comprise compositions of:
  a) at least one organic stripping solvent,
  b) fluoride ions from at least one of ammonium fluoride, ammonium bifluoride or hydrogen fluoride,
  c) at least one acidifying agent selected from inorganic or organic acids,
  d) water, and
  e) an oxidizing agent.

In such latter compositions, the oxidizing agent is generally added to the former compositions of the other components at a time generally just before the intended time of use of the composition. The FEOL compositions of this invention may additionally comprise one or more components such as metal-complexing/corrosion resisting compounds, other corrosion inhibitors and surfactants.

The method for FEOL stripping-cleaning of the ion-implanted wafer substrates according to this invention comprises a method for cleaning the ion-implanted wafer substrates without producing any substantial metal corrosion, the process comprising contacting the ion-implanted wafer substrate with a FEOL strip-cleaning composition of this invention for a time sufficient to clean the ion-implanted wafer substrate, wherein the FEOL stripping-cleaning compositions comprise:
  a) at least one organic stripping solvent,
  b) fluoride ions from at least one of ammonium fluoride, ammonium bifluoride or hydrogen fluoride,
  c) at least one acidifying agent selected from inorganic or organic acids, and
  d) water.

The FEOL strip-cleaning compositions to be used in the strip-cleaning method of this invention also comprise compositions of:
  a) at least one organic stripping solvent,
  b) fluoride ions from at least one of ammonium fluoride, ammonium bifluoride or hydrogen fluoride,
  c) at least one acidifying agent selected from inorganic or organic acids,
  d) water, and
  e) an oxidizing agent.

In such latter compositions, the oxidizing agent is generally added to the former compositions of the other components at a time generally just before the intended time of use of the composition. The FEOL compositions to be used in the strip-cleaning method of this invention may additionally comprise one or more components such as metal-complexing/corrosion resisting compounds, other corrosion inhibitors and surfactants.

The at least one organic stripping solvent will generally be present in the composition in an amount of from about 8 to about 90 wt %, preferably in an amount of from about 25 to about 85 wt %, and more preferably in an amount of from about 45 to about 82 wt %, based on the total weight of the composition. The organic stripping solvent will generally be an organic polar solvent. The solvent may comprise one or more such solvents. Suitable solvents include, but are not limited to dialkyl sulfones of the formula $R^1$—S(O)(O)—$R^2$ where $R^1$ and $R^2$ are alkyl of 1 to 4 carbon atoms, dimethyl sulfoxide (DMSO), tetrahydrothiophene-1,1-dioxide compounds such as sulfolane, methyl sulfolane and alkyl sulfolanes, dimethylacetamide and dimethylformamide. Most preferably the solvent is sulfolane.

The component(s) providing the fluoride ion in the compositions of this invention will generally be present in the compositions in an amount of from about 0.1 to about 2.0 wt %, preferably from about 0.1 to about 1.5 wt %, and more preferably from about 0.1 to about 0.8 wt %, based on the total weight of the composition. Fluoride ion sources may include hydrofluoric acid, ammonium fluoride and ammonium bifluoride, but not quaternary ammonium fluorides.

The acidifying agent(s) comprising inorganic or organic acids in the compositions of this invention will generally be present in the composition in an amount of from about 0.4 to about 7 wt %, preferably from about 0.6 to about 5 wt %, and more preferably from about 0.8 to about 3 wt %, based on the total weight of the composition. The inorganic and organic acids suitable for use in the compositions include, but are not limited to, hydrochloric, phosphoric, sulfuric, acetic or citric, and produce an overall acidic solution (pH<5). Acid selection influences both implanted polymer cleaning and overall material compatibility. Thus, the choice of acid can allow for shortened cleaning times or lower operating temperatures.

Water will be present in the compositions of this invention in an amount of from about 8 to about 90 wt %, preferably from about 10 to about 75 wt %, and more preferably from about 15 to about 50 wt %, based on the total weight of the composition.

When an oxidizing agent is employed in the compositions of this invention, the weight ratio of the totality of the other components to the oxidizing agent component will generally be a weight ratio of from about 1:1 to about 20:1, preferably a weight ratio of from about 1:1 to about 10:1, more preferably a weight ratio of from about 2:1 to about 5:1, and most preferably a weight ratio of about 3:1. Any suitable oxidizing agent may be employed in the FEOL stripping/cleaning compositions of this invention. Examples of such suitable oxidizing agent include, but are not limited to, hydrogen peroxide, peroxyacids, organic peroxides such as benzoyl peroxide hypochlorates, dichromates, permanganates, or nitric acid. The ozidizing agent is preferably hydrogen peroxide.

The compositions of this invention may also optionally contain other additional components. Such optional additional components include complexing agents and various surface active agents.

Organic or inorganic chelating or metal complexing agents/corrosion inhibitors are not required, but may optionally be included in the compositions of this invention, but offer substantial benefits, such as for example, improved product stability when incorporated into the aqueous cleaning compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e,g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt %, based on the total weight of the composition.

The compositions of the present invention may also optionally contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired. Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof. Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics. Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols. Anionic surfactants useful in the compositions of the present invention include carboxylates, N-acylsarcosinates, sulfonates, sulfates, and mono and diesters of orthophosphoric acid such as decyl phosphate.

Preferably, the anionic surfactants are metal-free surfactants. Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants. Example of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. The surfactant will generally be present in an amount of from 0 to about 5 wt %, preferably 0.001 to about 3 wt %, based on the weight of the composition.

Example of FEOL-stripping-cleaning compositions of this invention, without an oxidizing agent, include, but are not limited to, the compositions set forth in the following Tables 1 to 3 in which the component amounts are indicated in parts by weight.

TABLE 1

| Composition No. | Sulfolane | Water | HCl | NH$_4$F |
|---|---|---|---|---|
| 1 | 49 | 47.2 | 3 | 0.8 |
| 2 | 81.7 | 17 | 1 | 0.3 |
| 3 | 16.3 | 77.4 | 5 | 1.3 |
| 4 | 32.7 | 62.3 | 4 | 1 |
| 5 | 65.3 | 32.2 | 2 | 0.5 |

TABLE 2

| Composition No. | Sulfolane | Water | HCl | NH$_4$F |
|---|---|---|---|---|
| 6 | 81.7 | 11.2 | 1 | 0.3 |
| 7 | 81.7 | 16.5 | 0.5 | 0.3 |
| 8 | 81.7 | 16.6 | 1 | 0.1 |

TABLE 3

| Composition No. | Sulfolane | Water | Acid type | Acid | NH$_4$F |
|---|---|---|---|---|---|
| 9 | 81.7 | 15.3 | Glacial Acetic | 2.7 | 0.3 |
| 10 | 81.7 | 15.7 | Phosphoric | 2.3 | 0.3 |
| 11 | 81.7 | 10 | Phosphoric | 8.2 | 0.1 |
| 12 | 81.7 | 16 | Sulfuric | 2.0 | 0.3 |
| 13 | 81.7 | 14.9 | Citric | 3.1 | 0.3 |

Examples of FEOL-stripping-cleaning compositions of this invention, with an oxidizing agent, include, but are not limited to, the compositions set forth in the following Tables 4, 5, 6 and 7 in which the component amounts are indicated in parts by weight. In Table 4 the compositions are Composition 1 of Table 1 mixed in varying ratios with 30% hydrogen peroxide (unstabilized). In Table 5 the compositions are Composition 2 of Table 1 mixed in varying ratios with 30% hydrogen peroxide (unstabilized). In Table 6 the compositions are Compositions 6, 7 and 8 of Table 2 mixed with 30% hydrogen peroxide (unstabilized). In Table 7 the compositions are Compositions 9 to 13 of Table 3 mixed with 30% hydrogen peroxide (unstabilized).

TABLE 4

| Composition No. | Ratio of Comp. 1:$H_2O_2$ |
|---|---|
| 14 | 2:1 |
| 15 | 5:1 |
| 16 | 10:1 |

TABLE 5

| Composition No. | Ratio of Comp. 2:$H_2O_2$ |
|---|---|
| 17 | 2:1 |
| 18 | 5:1 |
| 19 | 10:1 |
| 20 | 1:5 |

TABLE 6

| Composition No. | Ratio of Comp.:$H_2O_2$ |
|---|---|
| 21 | Comp. 6:$H_2O_2$ 3:1 |
| 22 | Comp. 7:$H_2O_2$ 3:1 |
| 23 | Comp. 8 $H_2O_2$ 3:1 |

TABLE 7

| Composition No. | Ratio of Comp.:$H_2O_2$ |
|---|---|
| 24 | Comp. 9:$H_2O_2$ 3:1 |
| 25 | Comp. 10:$H_2O_2$ 3:1 |
| 26 | Comp. 11:$H_2O_2$ 3:1 |
| 27 | Comp. 12:$H_2O_2$ 3:1 |
| 28 | Comp. 13:$H_2O_2$ 3:1 |

Stripping/Cleaning Examples

Compositions 1 through 5 described above in Table 1 were used to clean unashed ion-implanted photoresist. In all cases the cleaning conditions were 65° C. for 30 minutes, followed by a 1 minute DI water rinse and nitrogen drying. Samples were analyzed by SEM to determine levels of photoresist removal. Results are summarized below in Table 8. In all cases, greater cleaning could be achieved by extending exposure time or increasing temperature.

TABLE 8

| Example No. | Composition No. | Clean |
|---|---|---|
| 1 | 1 | 80% |
| 2 | 2 | 90% |
| 3 | 3 | 20% |
| 4 | 4 | 40% |
| 5 | 5 | 60% |

Compositions 14-16 described in Table 4 above were used to clean unashed ion-implanted photoresist. In all cases the cleaning conditions were 65° C. for 30 minutes, followed by a 1 minute DI water rinse and nitrogen drying. Samples were analyzed by SEM to determine levels of photoresist removal. Results are summarized below in Table 9.

TABLE 9

| Example | Composition No. | Clean |
|---|---|---|
| 6 | 14 | 60% |
| 7 | 15 | 80% |
| 8 | 16 | 100% |

Compositions 17 to 20 described above in Table 5 were used to clean unashed ion-implanted photoresist. In all cases the cleaning conditions were 65° C. for 30 minutes, followed by a 1 minute DI water rinse and nitrogen drying. Samples were analyzed by SEM to determine levels of photoresist removal. Results are summarized below in Table 10.

TABLE 10

| Example No. | Composition No. | Clean |
|---|---|---|
| 9 | 17 | 100% |
| 10 | 18 | 100% |
| 11 | 19 | 100% |
| 12 | 20 | 70% |

Compositions 21 to 23 described in Table 6 were used to clean unashed ion-implanted photoresist. In all cases the cleaning conditions were 55° C. for 30 minutes, followed by a 1 minute DI water rinse and nitrogen drying. Samples were analyzed by SEM to determine levels of photoresist removal. Results are summarized below in Table 11.

TABLE 11

| Example No. | Composition No. | Etching | Cleaning |
|---|---|---|---|
| 13 | 21 | None | 100% |
| 14 | 22 | Some | 100% |
| 15 | 23 | None | 70% |

Compositions 24 to 28 described in Table 7 were used to clean unashed ion-implanted photoresist. The samples were exposed to the compositions for the times and temperatures listed below, followed by a 1 minute DI water rinse and nitrogen drying. Samples were analyzed by SEM to determine levels of photoresist removal. Results are summarized below in Table 12. When etching did occur, it was different structures etched depending on the formulation used. This prevents a clear numerical determination of etching, and is reported instead a severity of overall damage to the wafer. Reduced etching (i.e. examples 18 and 20) could be achieved through lowering temperature, exposure time, or modifying the ratio of solution to oxidizer.

TABLE 12

| Example No. | Composition No. | Time | Temperature | Etching | Cleaning |
|---|---|---|---|---|---|
| 16 | 24 | 10 min | 45° C. | slight | 100% |
| 17 | 25 | 10 min | 55° C. | slight | 50% |
| 18 | 25 | 30 min | 55° C. | severe | 100% |
| 19 | 26 | 30 min | 55° C. | none | 70% |
| 20 | 27 | 30 min | 55° C. | none | 100% |
| 21 | 28 | 10 min | 35° C. | serious | 100% |

The FEOL compositions of this invention are non-critical compositions and are devoid of supercritical $CO_2$.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A FEOL stripping and cleaning method for stripping/cleaning unashed ion-implanted photoresist from a wafer substrate, the process comprising conducting the process without supercritical $CO_2$ and comprises contacting the unashed ion-implanted photoresist on a wafer substrate with a FEOL stripping/cleaning composition for a time sufficient to clean the wafer substrate of the unashed ion-implanted photoresist, wherein the FEOL stripping/cleaning composition comprises:
    a) at least one organic stripping solvent,
    b) fluoride ions from at least one of ammonium fluoride, ammonium bifluoride and hydrogen fluoride,
    c) at least one acidifying agent selected from inorganic or organic acids other than HF,
    d) water, and
    e) at least one oxidizing agent:
        wherein the at least one acidifying agent selected from inorganic or organic acids other than HF is present in an amount to produce an overall acidic solution of pH>5.

2. A FEOL stripping and cleaning method according to claim 1 wherein the at least one oxidizing agent in the composition comprises hydrogen peroxide.

3. A FEOL stripping and cleaning method according to claim 1 wherein the at least one organic solvent in the composition is selected from the group consisting of dialkyl sulfones of the formula $R^1$—S(O)(O)—$R^2$ where $R^1$ and $R^2$ are alkyl of 1 to 4 carbon atoms, dimethyl sulfoxide (DMSO), tetrahydrothiophene-1,1-dioxide compounds, dimethylacetamide and dimethylformamide.

4. A FEOL stripping and cleaning method according to claim 2 wherein the at least one organic solvent in the composition is selected from the group consisting of dialkyl sulfones of the formula $R^1$—S(O)(O)—$R^2$ where $R^1$ and $R^2$ are alkyl of 1 to 4 carbon atoms, dimethyl sulfoxide (DMSO), tetrahydrothiophene-1,1-dioxide compounds, dimethylacetamide and dimethylformamide.

5. A FEOL stripping and cleaning method according to claim 3 wherein the at least one organic solvent in the composition comprises sulfolane.

6. A FEOL stripping and cleaning method according to claim 4 wherein the at least one organic solvent in the composition comprise sulfolane.

7. A FEOL stripping and cleaning method according to claim 5 wherein the at least one acid in the composition comprises hydrochloric acid.

8. A FEOL stripping and cleaning method according to claim 6 wherein the at least one acid in the composition comprises hydrochloric acid.

9. A FEOL stripping and cleaning method according to claim 1 wherein the composition comprises from about 45 to about 82 wt % of sulfolane, about 0.1 to about 2.0 wt % ammonium fluoride, about 0.8 to about 3 wt % hydrochloric acid, about 15 to about 50 wt % water, and the hydrogen peroxide is present in an amount such that the weight ratio of the other components to the hydrogen peroxide component is about 2:1 to about 5:1.

* * * * *